(12) United States Patent
Ivanov

(10) Patent No.: US 10,672,493 B2
(45) Date of Patent: Jun. 2, 2020

(54) SAMPLE AND HOLD CIRCUIT

(71) Applicant: TEXAS INSTRUMENTS INCORPORATED, Dallas, TX (US)

(72) Inventor: Vadim Valerievich Ivanov, Tucson, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/248,283

(22) Filed: Jan. 15, 2019

(65) Prior Publication Data

US 2020/0090777 A1 Mar. 19, 2020

Related U.S. Application Data

(60) Provisional application No. 62/732,066, filed on Sep. 17, 2018.

(51) Int. Cl.
*G11C 27/02* (2006.01)

(52) U.S. Cl.
CPC .................. *G11C 27/026* (2013.01)

(58) Field of Classification Search
CPC ..... G11C 27/02; G11C 27/024; G11C 27/026; G11C 27/028
USPC .............................................. 327/91, 94–96
See application file for complete search history.

(56) References Cited

U.S. PATENT DOCUMENTS

| 4,725,950 A * | 2/1988 | Woods | ................. H03G 3/3026 367/21 |
| 8,330,536 B1 * | 12/2012 | Quinn | ................. H03F 3/45475 330/109 |

* cited by examiner

*Primary Examiner* — Tomi Skibinski
(74) *Attorney, Agent, or Firm* — John R. Pessetto; Charles A. Brill; Frank D. Cimino

(57) ABSTRACT

A sample and hold circuit with long hold time. A sample and hold circuit includes an amplifier, a capacitor, a switch, and a sampling network. The capacitor includes a first terminal coupled to an inverting input of the amplifier. The switch includes a first terminal that is coupled to an output of the amplifier, and a second terminal that is coupled to the inverting input of the amplifier. The sampling network is coupled to a non-inverting input of the amplifier.

9 Claims, 2 Drawing Sheets

SAMPLE AND HOLD CIRCUIT

CROSS-REFERENCE TO RELATED APPLICATION

This application claims priority to U.S. Provisional Patent Application No. 62/732,066, filed Sep. 17, 2018, entitled "Sampling Long Hold Circuit," which is hereby incorporated herein by reference in its entirety.

BACKGROUND

Sample and hold circuitry is employed in numerous electronic circuit applications. For example, sample and hold circuitry plays a significant role in analog-to-digital converters. The typical sample and hold circuit includes a switching device, such as a transistor, and a capacitor. A time-varying input signal being sampled is periodically switched to the capacitor, thereby charging or discharging the capacitor, depending on the voltage of the signal as referenced to the voltage, already across the capacitor at the time of the sample. Between each of the sampling intervals is a hold interval during which the voltage level stored on the capacitor represents the signal sample. The stored voltage level for the signal sample can then be fed to the input of a successive circuit.

SUMMARY

Sample and hold circuits that provide a long hold time are disclosed herein. In one example, a sample and hold circuit includes an amplifier, a capacitor, a switch, and a sampling network. The capacitor includes a first terminal coupled to an inverting input of the amplifier. The switch includes a first terminal that is coupled to an output of the amplifier, and a second terminal that is coupled to the inverting input of the amplifier. The sampling network is coupled to a non-inverting input of the amplifier.

In another example, a sample and hold circuit includes an amplifier, a switch, a sampling network, and a capacitor. The switch is configured to switchable couple an output of the amplifier to an inverting input of the amplifier. The sampling network is coupled to a non-inverting input of the amplifier. The capacitor is coupled to an inverting input of the amplifier, and is configured to store offset voltage of the amplifier.

In a further example, a sample and hold circuit includes an amplifier a first switch, a second switch, a first capacitor, and a sampling network. The first switch includes a first terminal that is coupled to an output of the amplifier, and a second terminal that is coupled an inverting input of the amplifier. The second switch includes a first terminal that is coupled to the output of the amplifier. The first capacitor includes a first terminal that is coupled to the inverting input of the amplifier, and a second terminal that is coupled to a second terminal of the second switch. The sampling network includes a second capacitor, a third switch, and a fourth switch. The second capacitor includes a first terminal coupled to a non-inverting input of the amplifier, and a second terminal coupled to a reference voltage source. The third switch includes a first terminal that is coupled to the first terminal of the second capacitor, and a second terminal that is coupled to the second terminal of the first capacitor. The fourth switch includes a first terminal that is coupled to a second terminal of the third switch, and a second terminal that is coupled to an input terminal.

BRIEF DESCRIPTION OF THE DRAWINGS

For a detailed description of various examples, reference will now be made to the accompanying drawings in which.

DETAILED DESCRIPTION

Figure 1:
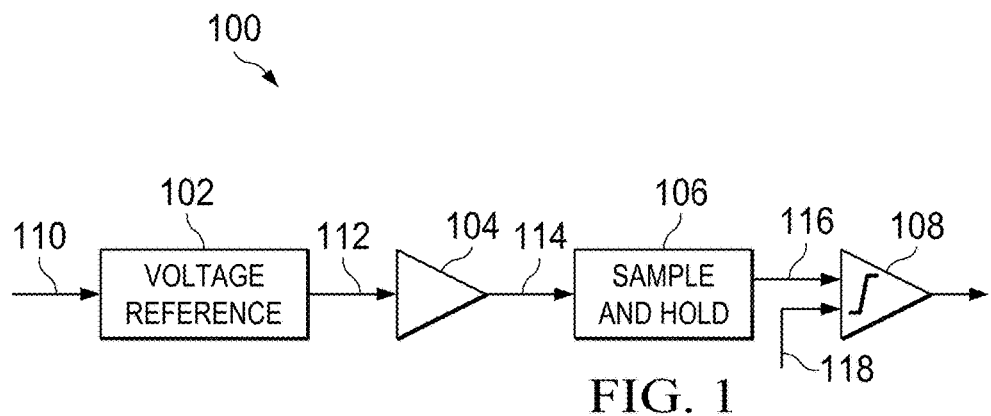
FIG. 1 shows a block diagram for an example sampled reference voltage circuit in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The operating time of a battery powered device may be extended by reducing the power consumption of the device, which, in turn, increases battery life. In some circuits, power consumption is reduced by disable power to the circuits when the circuits' function is not needed. In one example, reference voltage generation circuitry is powered down to reduce the quiescent power consumed by a circuit. A sample and hold circuit is coupled to the reference voltage generation circuitry. The sample and hold circuit samples the reference voltage and provides an output voltage representative of the reference voltage while the reference voltage generation circuit is disabled. The interval at which the reference voltage generation circuit must be powered is a function of the hold time of the sample and hold circuit. The longer the hold time of the sample and hold circuit, the less frequently the reference voltage generation circuit need be powered, and the lower the power consumed by the reference voltage generation circuit.

The sample and hold circuits disclosed herein provide a long hold time that allows for an increase in the time that circuitry generating a signal sampled by the sample and hold circuitry is disabled. Thus, the sample and hold circuits of the present disclosure reduce the power consumed by a circuit generating the signal sampled by the sample and hold circuit. In a sample and hold circuit, leakage in the sampling switch reduces the voltage on the sampling capacitor, and thus reduces the hold time of the sample and hold circuit. The sample and hold circuits described herein include circuitry that reduces leakage in the sampling switch to increase hold time.

Leakage in the sampling switch is a function of the voltage across the sampling switch. The circuitry described herein reduces the sampling switch leakage by reducing the voltage across the sampling switch when the sampling switch is open (i.e., during hold time). The circuitry measures offset voltage at the output of the sample and hold circuit amplifier while the sample and hold circuit is sampling a signal, and applies the measured offset voltage to reduce amplifier offset during hold time, which in turn reduces the voltage across the sampling switch during hold time. Some implementations include multiple amplifiers that alternately measure offset and control the voltage across the sampling switch to greatly increase the hold time of the sample and hold circuit.

FIG. 1 shows a block diagram for an example sampled reference voltage circuit 100 in accordance with the present disclosure. The sampled reference voltage circuit 100 is one example of a circuit that benefits from using a long hold time sample and hold circuit as disclosed herein to reduce circuit power consumption. The sampled reference voltage circuit 100 includes a voltage reference circuit 102, an amplifier 104, a sample and hold circuit 106, and a comparator 108. The voltage reference circuit 102 is a band gap circuit in some implementations of the sampled reference voltage circuit 100. An enable signal 110 enables or disables operation of the voltage reference circuit 102. Power consumption of the voltage reference circuit 102 is reduced when the enable signal 110 disables the voltage reference circuit 102. When enabled, the voltage reference circuit 102 generates a reference voltage 112. The amplifier 104 scales the reference voltage 112 as needed for use in the sampled reference voltage circuit 100. Some implementations of the sampled reference voltage circuit 100 lack the amplifier 104. The output signal output signal 114 of the amplifier 104 is provided to the sample and hold circuit 106.

The sample and hold circuit 106 samples (or tracks) the output signal 114 while the voltage reference circuit 102 is enabled by the enable signal 110, and holds the sampled voltage of the output signal 114 while the enable signal 110 disables the voltage reference circuit 102. Thus, the output signal 116 of the sample and hold circuit 106 is representative of the output signal 114 while the voltage reference circuit 102 is disabled. The sample and hold circuit 106 includes circuitry that allows the output signal 116 to accurately represent the output signal 114 for an extended time. That is, the sample and hold circuit 106 includes circuitry that enables a long hold time. The long hold time increases the time that the voltage reference circuit 102 can be disabled, and decreases the power consumed by the sampled reference voltage circuit 100. The output signal 116 is provided to the comparator 108.

The comparator 108 compares the output signal 116 to a signal 118. For example, if the sampled reference voltage circuit 100 is powered by a battery, then the signal 118 is representation of the voltage of the battery, and the comparator 108 compares the output signal 116 to the signal 118 to determine whether the voltage of the battery has fallen below a threshold represented by the output signal 116. The output signal 116 is applied in a variety of different applications in various implementations of the sampled reference voltage circuit 100.

Figure 2:
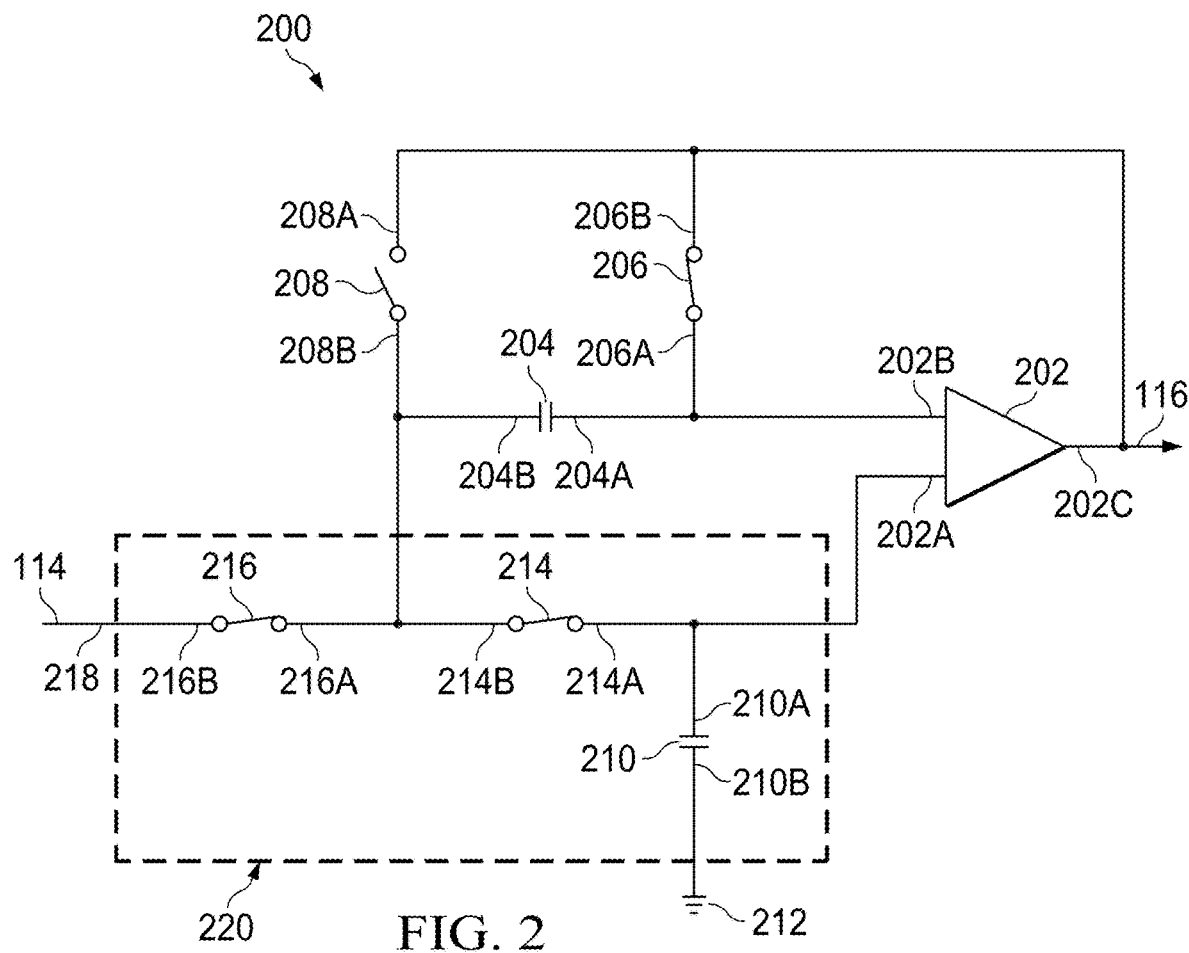
FIG. 2 shows a schematic diagram for a first example sample and hold circuit that provides a long hold time in accordance with the present disclosure.

FIG. 2 shows a schematic diagram for a first example sample and hold circuit 200 that provides a long hold time in accordance with the present disclosure. The sample and hold circuit 200 is an implementation of the sample and hold circuit 106. The sample and hold circuit 200 includes an amplifier 202, a capacitor 204, a switch 206, a switch 208, and a sampling network 220. The sampling network 220 includes a sampling capacitor 210, a sampling switch 214, and a switch 216. In FIG. 2, the switches 206, 208, 214, and 216 are shown in sampling mode. That is, in the sampling mode, when the sample and hold circuit 200 is sampling the output signal 114, the switches 206, 214, and 216 are closed, and the switch 208 is open. In the hold mode, when the sample and hold circuit 200 is not sampling the output signal 114, the switches 206, 214, and 216 are open, and the switch 208 is closed.

The non-inverting input 202A of the amplifier 202 is coupled to the sampling network 220. More specifically, the non-inverting input 202A of the amplifier 202 is coupled to a terminal 210A of the sampling capacitor 210 and a terminal 214A of the sampling switch 214. The terminal 210B of the sampling capacitor 210 is coupled to ground or other reference voltage source 212. The terminal 214B of the sampling switch 214 is coupled to the terminal 216A of the switch 216, the terminal 204B of the capacitor 204, and the terminal 208B of the switch 208. The terminal 216B of the switch 216 is coupled to the input terminal 218 for receipt of the output signal 114. The switch 216 switchably couples the output signal 114 to the capacitor 204, the sampling switch 214, and the switch 208. The sampling switch 214 switchably couples the sampling capacitor 210 to the capacitor 204 and the switch 216.

The output 202C of the amplifier 202 is coupled the terminal 206B of the switch 206 and the terminal 208A of the switch 208. The switch 208 switchably couples the output 202C of the amplifier 202 to the terminal 204B of the capacitor 204. The inverting input 202B of the amplifier 202 is coupled to the terminal 204A of the capacitor 204 and the terminal 206A of the switch 206. The switch 206 switchably couples the output 202C of the amplifier 202 to the inverting input 202B of the amplifier 202.

When the sample and hold circuit 200 is sampling the output signal 114 (i.e., the switches switch 206, switch 208, sampling switch 214, and switch 216 are configured as shown in FIG. 2), the sampling capacitor 210 is charged to the voltage of the output signal 114, and the capacitor 204 is charged to (i.e., the capacitor 204 stores) the offset voltage of the amplifier 202. When the sample and hold circuit 200 transitions to the hold mode (i.e., the switches 206, 214, and 216 are open, and the switch 208 is closed), the offset voltage stored on the capacitor 204 is subtracted from the output signal 116 at the output of the amplifier 202, and the voltage across the sampling switch 214 is very small (e.g., micro-volts). As a result, the leakage in the sampling switch 214 is very small, and the charge on the sampling capacitor 210 changes very slowly. Consequently, the hold time of the sample and hold circuit 200 is several minutes in some implementations, and the source (e.g., the voltage reference circuit 102) of the output signal 114 may remain unpowered for the duration of the hold time to conserve power.

Figure 3:
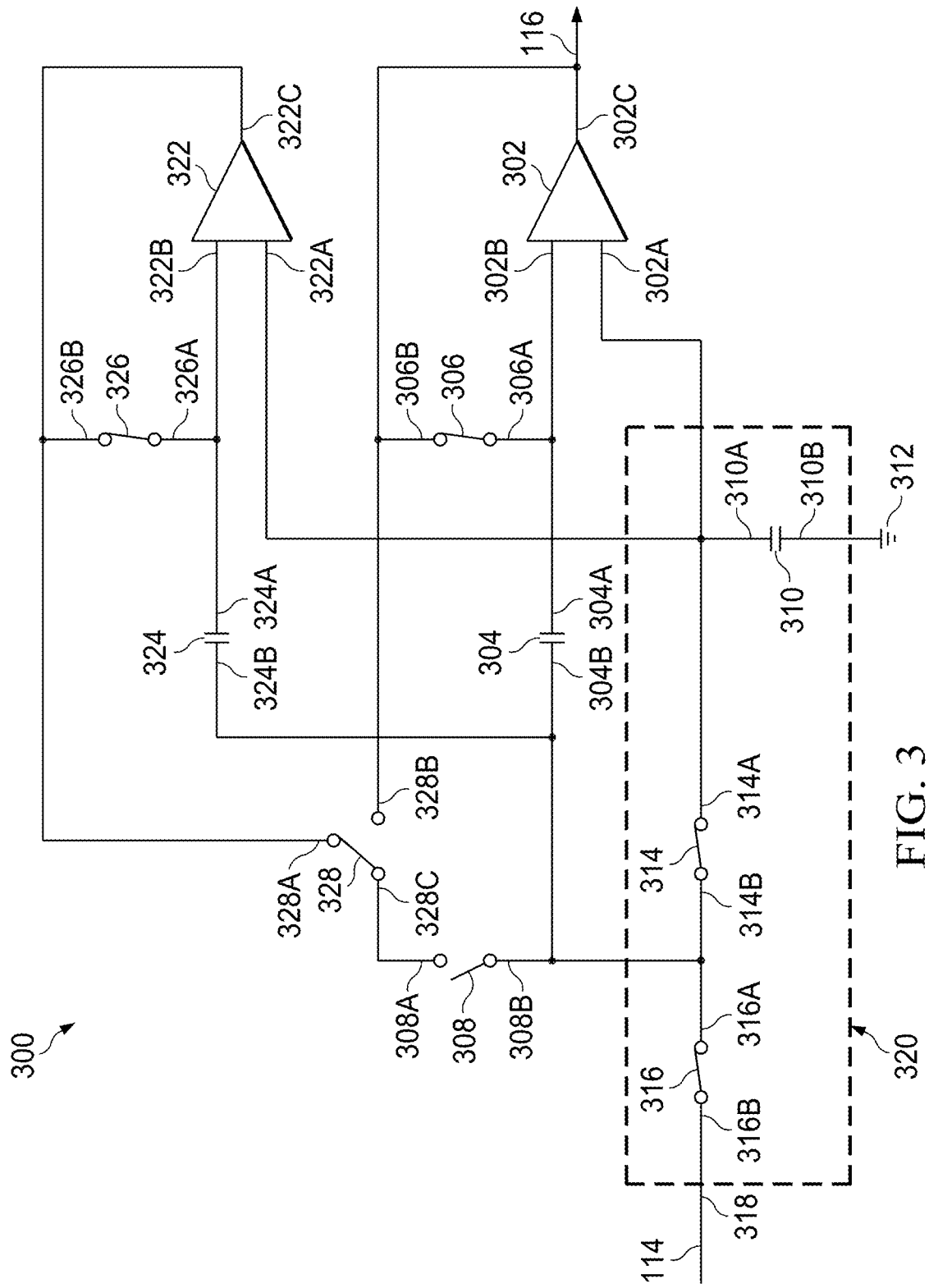
FIG. 3 shows a schematic diagram for a second example sample and hold circuit that provides a long hold time in accordance with the present disclosure.

FIG. 3 shows a schematic diagram for a second example sample and hold circuit 300 that provides a long hold time in accordance with the present disclosure. The sample and hold circuit 300 is an implementation of the sample and hold circuit 106. The sample and hold circuit 300 includes an amplifier 302, a capacitor 304, a switch 306, a switch 308, and a sampling network 320. The sample and hold circuit 300 also includes an amplifier 322, a capacitor 324, a switch 326, and a switch 328. The sampling network sampling network 320 includes a sampling capacitor 310, a sampling switch 314, and a switch 316. In FIG. 3, the switches 306, 308, 314, and 316 are shown in sampling mode. That is, in the sampling mode, when the sample and hold circuit 300 is sampling the output signal 114, the switches 306, 314, and 316 are closed, the switches 308 and 326 are open. In some implementations of the sample and hold circuit 300, the switch 326 is closed during sampling of the output signal 114.

In the hold mode, the switch 328 is toggled to alternately connect the output of one of the amplifier 302 or the amplifier 322 to the sampling switch 314, the capacitor 304, and the capacitor 324. The one of the amplifier 302 or the amplifier 322 not connected to the sampling switch 314 at a given time is accumulating offset of the amplifier on the capacitor (304 or 324) connected to the inverting input of the amplifier. In this way, the sample and hold circuit 300 maintains a low voltage (e.g., micro-volts) across the sampling switch 314 for an even longer period (e.g., 10× or more) than is attainable with some implementations of the sample and hold circuit 200. In the hold mode, when the sample and hold circuit 300 is not sampling the output signal 114, the switches 314 and 316 are open, the switch 308 is closed, and the states of the switches 306, 326, and 328 are dependent on which of the amplifier 302 or the amplifier 322 is driving the sampling switch 314. If the switch 328 is connecting the amplifier 302 to the sampling switch 314, then the switch 306 is open and the switch 326 is closed. If the switch 328 is connecting the amplifier 322 to the sampling switch 314, then the switch 326 is open and the switch 306 is closed.

The non-inverting input 302A of the amplifier 302 is coupled to the sampling network 320, and to the non-inverting input 322A of the amplifier 322. More specifically, the non-inverting input 302A of the amplifier 302 is coupled to a terminal 310A of the sampling capacitor 310 and a terminal 314A of the sampling switch 314. The terminal 310B of the sampling capacitor 310 is coupled to ground or other reference voltage source 312. The terminal 314B of the sampling switch 314 is coupled to the terminal 316A of the switch 316, the terminal 304B of the capacitor 304, and the terminal 308B of the switch 308. The terminal 316B of the switch 316 is coupled to the input terminal 318 for receipt of the output signal 114. The switch 316 switchably couples the output signal 114 to the capacitor 304, the sampling switch 314, and the switch 308. The sampling switch 314 switchably couples the sampling capacitor 310 to the capacitor 304 and the switch 316.

The output 302C of the amplifier 302 is coupled the terminal 306B of the switch 306 and the terminal 328B of the switch 328. The terminal 328C of the switch 328 is coupled to the terminal 308A of the switch 308. The switch 308 switchably couples the switch 328 to the sampling network 320, the capacitor 304, and the capacitor 324. The switch 328 switchably couples the amplifier 302 or the amplifier 332 to the switch 308. The output 302C of the amplifier 302 is coupled to the terminal 328B of the switch 328, and the output 322C of the amplifier 322 is coupled to the terminal 328A of the switch 328. The inverting input 302B of the amplifier 302 is coupled to the terminal 304A of the capacitor 304 and the terminal 306A of the switch 306. The switch 306 switchably couples the output 302C of the amplifier 302 to the inverting input 302B of the amplifier 302. The inverting input 322B of the amplifier 322 is coupled to the terminal 324A of the capacitor 324 and the terminal 326A of the switch 326. The terminal 324B of the capacitor 324 is coupled to the terminal 304B of the capacitor 304. The output 322C of the amplifier 322 is coupled to the terminal 326B of the switch 326. The switch 326 switchably couples the output 322C of the amplifier 322 to the inverting input 322B of the amplifier 322.

When the sample and hold circuit 300 is sampling the output signal 114, the sampling capacitor 310 is charged to the voltage of the output signal 114, and the capacitor 304 is charged to the offset voltage of the amplifier 302 and/or the capacitor 324 is charged to the offset voltage of the amplifier 322 (i.e., the capacitor 304 stores the offset voltage of the amplifier 302 and/or the capacitor 324 stores the offset voltage of the 322). When the sample and hold circuit 300 transitions to the hold mode (i.e., the switches 206, 214, and 216 open, and the switch 208 is closed), the switch 328 connects the amplifier 302 to the sampling switch 314 for a selected time, and then disconnects the amplifier 302 from the sampling switch 314 and connects the amplifier 322 to the sampling switch 314 for a time. Alternate connection of the amplifier 302 and amplifier 322 to the sampling switch 314 may continue for an indefinite period. During the times that the amplifier 302 or the amplifier 322 is not connected to the sampling switch 314, the capacitor 304 or the capacitor 324 measures the offset voltage of the corresponding amplifier.

The various switches of the sample and hold circuit 200 and the sample and hold circuit 300 are implemented using metal oxide semiconductor field effect transistors as analog switches in some implementations.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A sample and hold circuit, comprising:
    an amplifier;
    a capacitor comprising a first terminal coupled to an inverting input of the amplifier;
    a switch comprising:
        a first terminal coupled to an output of the amplifier; and
        a second terminal coupled to the inverting input of the amplifier; and
    a sampling network coupled to a non-inverting input of the amplifier;
    wherein:
        the amplifier is a first amplifier;
        the capacitor is a first capacitor;
        the switch is a first switch; and
        the sample and hold circuit further comprises:
            a second amplifier comprising a non-inverting input coupled to the non-inverting input of the first amplifier; and
            a second capacitor comprising:
                a first terminal coupled to an inverting input of the second amplifier; and
                a second terminal coupled to a second terminal of the first capacitor.

2. The sample and hold circuit of claim 1, further comprising a second switch comprising:
    a first terminal coupled to the inverting input of the second amplifier; and
    a second terminal coupled to an output of the second amplifier.

3. The sample and hold circuit of claim 2, further comprising a third switch comprising:
    a first terminal coupled to the output of the second amplifier; and
    a second terminal coupled to the output of the first amplifier.

4. The sample and hold circuit of claim 3, further comprising a fourth switch comprising:
    a first terminal coupled a third terminal of the third switch; and
    a second terminal coupled to the second terminal of the first capacitor.

5. A sample and hold circuit, comprising:
an amplifier;
a switch configured to switchable couple an output of the amplifier to an inverting input of the amplifier;
a sampling network coupled to a non-inverting input of the amplifier; and
a capacitor coupled to the inverting input of the amplifier, and configured to store offset voltage of the amplifier;
wherein:
the amplifier is a first amplifier;
the capacitor is a first capacitor; and
the sample and hold circuit further comprises a second amplifier comprising a non-inverting input coupled to the non-inverting input of the first amplifier.

6. The sample and hold circuit of claim 5, wherein:
the capacitor is a first capacitor; and
the sample and hold circuit further comprises a second capacitor coupled to an inverting input of the second amplifier, and configured to store offset voltage of the second amplifier.

7. The sample and hold circuit of claim 6, wherein:
the switch is a first switch; and
the sample and hold circuit further comprises a second switch configured to couple the output of the second amplifier to the inverting input of the second amplifier.

8. The sample and hold circuit of claim 7, further comprising a third switch configured to switchably couple the output of the second amplifier or the output of the first amplifier to the first capacitor.

9. The sample and hold circuit of claim 7, further comprising a fourth switch configured to switchably couple the third switch to the first capacitor.

* * * * *